(12) United States Patent
Namiki et al.

(10) Patent No.: US 9,487,678 B2
(45) Date of Patent: Nov. 8, 2016

(54) ANISOTROPIC CONDUCTIVE ADHESIVE, LIGHT EMITTING DEVICE, AND METHOD FOR PRODUCING ANISOTROPIC CONDUCTIVE ADHESIVE

(71) Applicant: DEXERIALS CORPORATION, Tokyo (JP)

(72) Inventors: Hidetsugu Namiki, Tochigi (JP); Shiyuki Kanisawa, Tochigi (JP); Hideaki Umakoshi, Tochigi (JP); Masaharu Aoki, Tochigi (JP); Akira Ishigami, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 14/830,070

(22) Filed: Aug. 19, 2015

(65) Prior Publication Data

US 2015/0353781 A1    Dec. 10, 2015

Related U.S. Application Data

(63) Continuation of application No. PCT/JP2014/053460, filed on Feb. 14, 2014.

(30) Foreign Application Priority Data

Feb. 19, 2013    (JP) .................................. 2013-029868

(51) Int. Cl.
*C09J 11/00*    (2006.01)
*H01L 33/60*    (2010.01)
(Continued)

(52) U.S. Cl.
CPC . *C09J 11/00* (2013.01); *C09J 9/02* (2013.01); *C23C 14/025* (2013.01); *C23C 14/205* (2013.01); *C23C 14/223* (2013.01);
(Continued)

(58) Field of Classification Search
CPC ..... H01L 33/62; H01L 33/60; H01L 33/486; H01L 24/29; H01L 24/32; H01L 24/83; H01L 2224/16225; H01L 2224/16227; H01L 2224/2929; H01L 2224/2939; H01L 2224/29413; H01L 2924/07802; H01L 2924/12041; H01L 2924/181; C09J 9/02; C09J 11/00; C08K 7/16; C08K 9/00; C23C 14/025; C23C 14/223

See application file for complete search history.

(56) References Cited

FOREIGN PATENT DOCUMENTS

JP    H05-152464 A    6/1993
JP    2003-013021 A    1/2003
(Continued)

OTHER PUBLICATIONS

May 20, 2014 International Search Report issued in PCT/JP2014/053460.

*Primary Examiner* — Armando Rodriguez
(74) *Attorney, Agent, or Firm* — Oliff PLC (57) ABSTRACT

Provided is a light emitting device high in the intensity of emitted light. A blue LED chip having a peak of emitted light in a wavelength range of at least 360 nm and at most 500 nm is adhered to an electrode substrate by an anisotropic conductive adhesive. A light reflecting layer made of a silver alloy on a surface of each conductive particle contained in the anisotropic conductive adhesive, and has high reflectance with respect to blue light. The light reflecting layer is formed by sputtering of a sputtering target that contains Ag, Bi, and Nd with the content ratio of Bi set to at least 0.1 weight % (wt %) and at most 3.0 wt % and the content ratio of Nd set to at least 0.1 weight % and at most 2.0 wt % with respect to the total weight of Ag, Bi, and Nd of 100 wt %. The conductive particle has high anti-migration properties.

6 Claims, 4 Drawing Sheets

(51) Int. Cl.

| | | |
|---|---|---|
| *H01L 33/48* | (2010.01) | |
| *C09J 9/02* | (2006.01) | |
| *H01L 33/62* | (2010.01) | |
| *H01L 23/00* | (2006.01) | |
| *C23C 14/02* | (2006.01) | |
| *C23C 14/20* | (2006.01) | |
| *C23C 14/22* | (2006.01) | |
| *C08K 7/16* | (2006.01) | |
| *C08K 9/00* | (2006.01) | |

(52) U.S. Cl.
CPC ............ *H01L 24/29* (2013.01); *H01L 33/486* (2013.01); *H01L 33/60* (2013.01); *H01L 33/62* (2013.01); *C08K 7/16* (2013.01); *C08K 9/00* (2013.01); *H01L 24/32* (2013.01); *H01L 24/83* (2013.01); *H01L 2224/16225* (2013.01); *H01L 2224/16227* (2013.01); *H01L 2224/2929* (2013.01); *H01L 2224/2939* (2013.01); *H01L 2224/29413* (2013.01); *H01L 2224/29439* (2013.01); *H01L 2224/29455* (2013.01); *H01L 2224/73104* (2013.01); *H01L 2224/73204* (2013.01); *H01L 2224/81192* (2013.01); *H01L 2224/81903* (2013.01); *H01L 2224/8385* (2013.01); *H01L 2224/83192* (2013.01); *H01L 2224/83862* (2013.01); *H01L 2224/9211* (2013.01); *H01L 2924/07802* (2013.01); *H01L 2924/12041* (2013.01); *H01L 2924/181* (2013.01)

(56) References Cited

FOREIGN PATENT DOCUMENTS

| | | |
|---|---|---|
| JP | 2003-026763 A | 1/2003 |
| JP | 2005-120375 A | 5/2005 |
| JP | 2008-266671 A | 11/2008 |
| JP | 2010-129472 A | 6/2010 |
| JP | 2011-065958 A | 3/2011 |
| JP | 2012-174800 A | 9/2012 |

ANISOTROPIC CONDUCTIVE ADHESIVE, LIGHT EMITTING DEVICE, AND METHOD FOR PRODUCING ANISOTROPIC CONDUCTIVE ADHESIVE

This application is a continuation of International Application No. PCT/JP2014/53460, filed on Feb. 14, 2014, which claims priority to Japan Patent Application No. 2013-029868, filed on Feb. 19, 2013. The contents of the prior applications are herein incorporated by references in their entireties.

BACKGROUND

The present invention generally relates to an anisotropic conductive adhesive used to anisotropic conductively connect an LED element to an electrode substrate, and an LED light emitting device that has an LED element mounted on an electrode substrate using the anisotropic conductive adhesive.

Optical function elements that use an LED are attracting attention in recent years.

Optical function elements of this type employ flip chip mounting in which an LED chip is directly mounted on a wiring board, for the purpose of size reduction or the like.

Figure 7A:
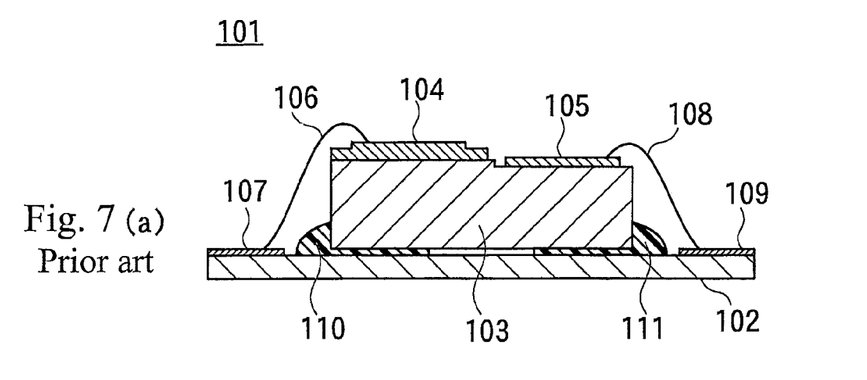
FIG. 7(a) is a sectional view for illustrating a mounting method using wire bonding.
Figure 7B:
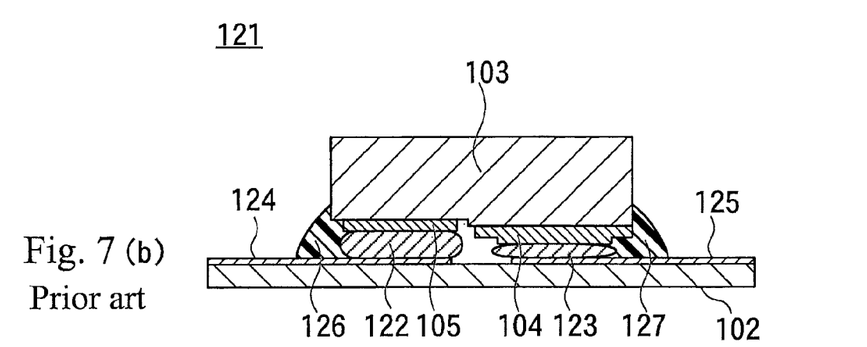
FIG. 7(b) is a sectional view for illustrating a process using conductive paste.
Figure 7C:
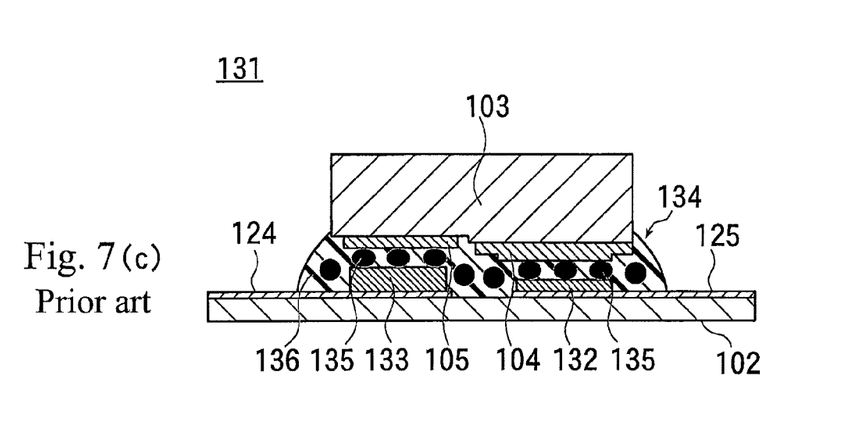
FIG. 7(c) is a sectional view for illustrating a process using an anisotropic conductive adhesive.

Various methods of mounting an LED chip on a wiring board by flip chip mounting have hitherto been known as shown in FIG. 7(a) to FIG. 7(c).

FIG. 7(a) shows a mounting method that uses wire bonding. In a light emitting device 101 of FIG. 7(a), a die bonding adhesive 110 and a die bonding adhesive 111 fix an LED chip 103 onto a wiring board 102 in a state such that a first electrode 104 and a second electrode 105 of the LED chip 103 are positioned upward side (the side opposite from the wiring board 102).

By bonding wires 106 and 108, a first pattern electrode 107 and a second pattern electrode 109 on the wiring board 102 are electrically connected to the first electrode 104 and the second electrode 105 of the LED chip 103, respectively.

FIG. 7(b) shows a mounting method that uses conductive paste.

In a light emitting device 121 shown in FIG. 7(b), a first electrode 104 and a second electrode 105 of an LED chip 103 are electrically connected to a first pattern electrode 124 and a second pattern electrode 125 of a wiring board 102 by conductive paste 122 and conductive paste 123, which are, for example, copper paste in a state such that the first electrode 104 and the second electrode 105 of the LED chip 103 face toward the wiring board 102. The LED chip 103 is also adhered onto the wiring board 102 by a sealing resin 126 and a sealing resin 127.

FIG. 7(c) shows a mounting method using an anisotropic conductive adhesive.

In a light emitting device 131 shown in FIG. 7(c), a first electrode 104 and a second electrode 105 of an LED chip 103 are electrically connected to a bump 132 and a bump 133, which are formed on a first pattern electrode 124 and a second pattern electrode 125 of a wiring board 102, respectively, by conductive particles 135 in an anisotropic conductive adhesive 134 in a state such that the first electrode 104 and the second electrode 105 of the LED chip 103 face toward the wiring board 102. The LED chip 103 is also adhered onto the wiring board 102 by an insulating adhesive resin 136 in the anisotropic conductive adhesive 134.

However, the conventional art described above has various problems.

Firstly, in the mounting method using wire bonding, light emission efficiency is low because the bonding wires 106 and 108, which are made of gold, absorb light having a wavelength of, for example, 400 nm to 500 nm.

In this method, cure time of the die bonding adhesive 110 and the die bonding adhesive 111 is long because of the use of an oven for the curing, and it is difficult to improve production efficiency.

In the mounting method using the conductive paste 122 and the conductive paste 123, on the other hand, the adhesion force of the conductive paste 122 and the conductive paste 123 alone is weak and needs additional strength by the sealing resin 126 and the sealing resin 127. The sealing resin 126 and the sealing resin 127, however, degrade light emission efficiency by causing light diffusion or light absorption into the conductive paste 122 and the conductive paste 123.

This method also suffers from a long cure time for the sealing resin 126 and the sealing resin 127 because of the use of an oven for the curing, which makes it difficult to improve production efficiency.

In other mounting methods where the anisotropic conductive adhesive 134 is used, the color of the conductive particles 135 in the anisotropic conductive adhesive 134 is brown so that the insulating adhesive resin 136 is consequently colored brown as well. The coloring causes the anisotropic conductive adhesive 134 to absorb light, which thereby degrades light emission efficiency.

As a solution to those problems, an anisotropic conductive adhesive has been proposed that does not degrade light emission efficiency by forming a conductive layer using silver (Ag) having high light reflectance and low electric resistance, and thus reducing the absorption of light.

However, silver is a chemically unstable material and has a problem of being susceptible to oxidation and sulfuration. Another problem with using silver is that energization after thermal compression bonding causes migration, which leads to a breakage in wiring and to decrease in adhesion strength due to the deterioration of the adhesive.

In order to solve the above-discussed problem, an Ag-based alloy thin film that has excellent reflectance, corrosion resistance, and anti-migration properties has been proposed, for example, see JPA2008-266671, JPA 2005-120375, JPA H05-152464 and JPA 2003-26763.

Covering the surface of a conductive particle with this Ag-based alloy thin film improves corrosion resistance and anti-migration properties. However, the use of, for example, nickel in a base layer in combination with the Ag-based alloy thin film as the topmost layer gives rise to a problem such that the entire reflectance of the conductive particles is degraded by the reflectance of nickel, which is lower than the reflectance of Ag.

In addition, Au or Ni exposed on the surface of the conductive particles 135 causes light absorption and consequently decrease light emission efficiency.

SUMMARY OF THE INVENTION

It is an object of the present invention to provide a light emitting device having a high intensity of emitted light at a wavelength of at least 360 nm and at most 500 nm.

The present invention is an anisotropic conductive adhesive for electrically connecting an electrode substrate to an LED element having a peak which is a maximum intensity of emitted light, positioned within a range of a wavelength at least 360 nm and at most 500 nm, by adhering electrodes of the LED element to electrodes of the electrode substrate, the anisotropic conductive adhesive including conductive particles, and an adhesive binder. Each of the conductive particles including a resin particle, a base layer formed on a surface of the resin particle by electrolytic plating method, and a conductive light reflecting layer formed on a surface of the base layer by sputtering method, where the conductive light reflecting layer includes Ag, Bi, and Nd, and the light reflecting layer is formed by sputtering of a sputtering target which contains Ag, Bi, and Nd having a content ratio of Bi set to at least 0.1 weight % and at most 3.0 weight % and a content ratio of Nd set to at least 0.1 weight % and at most 2.0 weight % with respect to a total weight of Ag, Bi, and Nd of 100 weight %.

The preset invention is the anisotropic conductive adhesive, where the cured anisotropic conductive adhesive has a reflectance of 30% or higher at a wavelength in a range of at least 360 nm and at most 740 nm.

The present invention is the anisotropic conductive adhesive wherein the base layer is made of a thin nickel film.

The present invention is the anisotropic conductive adhesive, wherein at least 1 part by weight and at most 100 parts by weight of the conductive particles are contained with respect to 100 parts by weight of the adhesive binder which is thermally curable and has insulating properties.

The present invention is a light emitting device including an LED element adhered to a substrate by an anisotropic conductive adhesive. The LED element having a peak which is a maximum intensity of emitted light, positioned within a range of a wavelength at least 360 nm and at most 500 nm, the anisotropic conductive adhesive which includes conductive particles in an adhesive. Each of the conductive particles including a resin particle, a base layer formed on a surface of the resin particle by electrolytic plating method, and a conductive light reflecting layer formed on a surface of the base layer by sputtering method, conductive light reflecting layer containing Ag, Bi, and Nd, and the light reflecting layer is formed by sputtering of a sputtering target that contains Ag, Bi, and Nd with a content ratio of Bi set to at least 0.1 weight % and at most 3.0 weight % and a content ratio of Nd set to at least 0.1 weight % and at most 2.0 weight % with respect to a total weight of Ag, Bi, and Nd of 100 weight %.

The present invention is an anisotropic conductive adhesive manufacturing method for manufacturing an anisotropic conductive adhesive by dispersing conductive particles in an adhesive. The conductive particles of the anisotropic conductive adhesive are formed by forming a base layer by electrolytic plating method on a surface of each resin particle, and forming a light reflecting layer on a surface of the base layer by performing sputtering on a sputtering target that contains Ag, Bi, and Nd with a content ratio of Bi set to at least 0.1 weight % and at most 3.0 weight % and a content ratio of Nd set to at least 0.1 weight % and at most 2.0 weight % with respect to a total weight of Ag, Bi, and Nd of 100 weight %.

According to the one embodiment of the present invention, the anisotropic conductive adhesive has high reflectance with respect to light having a wavelength of at least 360 nm and at most 500 nm and the conductive particles have high anti-migration properties, so that an emitting device having highly reliable light and high intensity of emitted light at a wavelength of at least 360 nm or more and at most 500 nm or less can be obtained.

DETAILED DESCRIPTION OF EMBODIMENTS

A light emitting device of the present invention is described first.

Figures 2A, 2B:
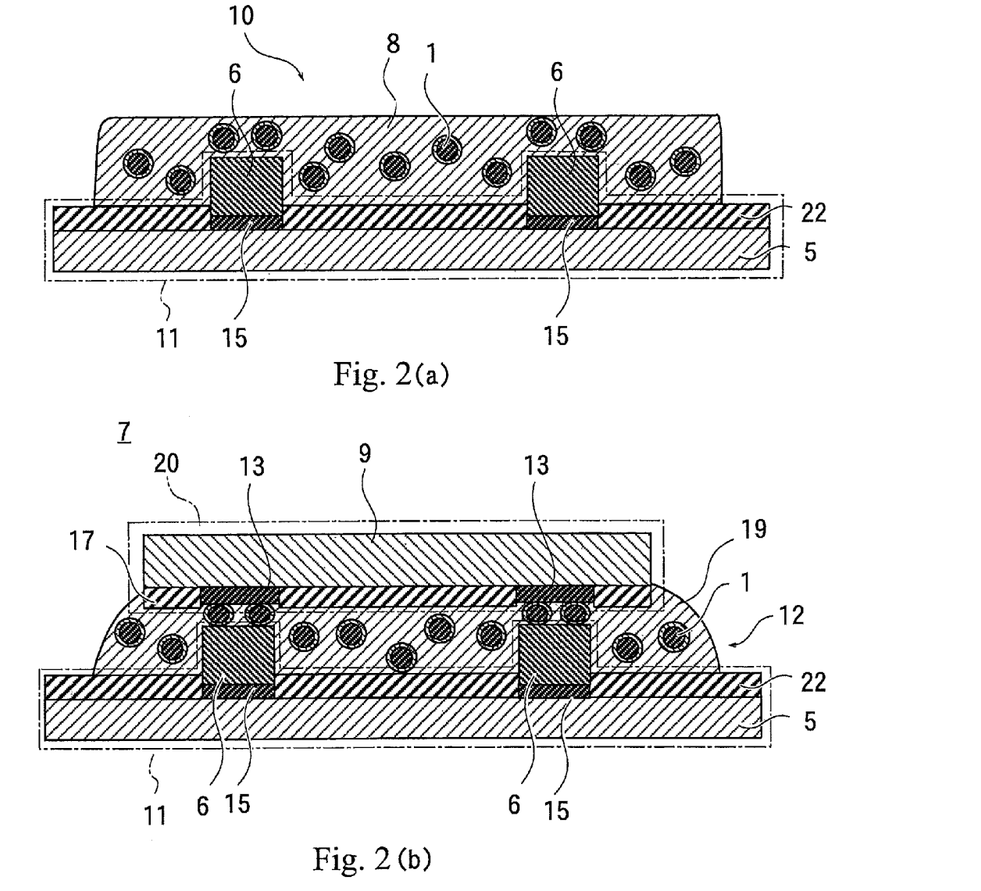
FIG. 2(a) is a sectional view of a state in which an anisotropic conductive adhesive is applied on an electrode substrate.
FIG. 2(b) is a sectional view for illustrating an LED light emitting device.

Referring to FIG. 2(b), the light emitting device 7 of the present invention includes an electrode substrate 11 having an LED element 20 having a peak in which the maximum value of the intensity of emitted light is at a wavelength in a range of from at least 360 nm to at most 500 nm.

The LED element 20 has a semiconductor chip 9, which is a cut piece of a semiconductor substrate. A p-n junction is formed in the semiconductor chip 9 by an introduced impurity (dopant). Two electrodes 13 are arranged apart from each other on one surface of the semiconductor chip 9.

On the surface of the semiconductor chip 9 where the electrodes 13 are arranged, an insulating protective film 17 is formed so as to at least partially expose the electrodes 13.

The electrode substrate 11 has a substrate main body 5 made of epoxy glass. Two connection terminals 15 formed of a metal film are provided apart from each other on the substrate main body 5.

An insulating protective film 22 is formed on a surface of the substrate main body 5 in a manner such that at least a part of the connection terminals 15 is exposed. Bumps 6 each having a flat top are formed in the exposed portions of the connection terminals 15.

It is sufficient if the bumps 6 are formed on at least one of the surfaces of the connection terminals 15 of the electrode substrate 11 and surfaces of the electrodes 13 of the LED element 20. The bumps 6 desirably have flat tops also when formed on the electrodes 13 of the LED element 20. In this case, one bump 6 having a flat top is formed on the surface of each connection terminal 15.

The distance between the two electrodes 13 formed on the LED element 20 is equal to the distance between the two bumps 6 formed on the electrode substrate 11. The LED element 20 and the electrode substrate 11 are pressed against each other when an uncured anisotropic conductive adhesive is interposed between the LED element 20 and the electrode substrate 11, in a manner such that the electrodes 13 and the bumps 6 are into contact with each other on a one-to-one basis, and then, the uncured anisotropic conductive adhesive is cured to fix the LED element 20 to the electrode substrate 11.

Figures 1A, 1B:
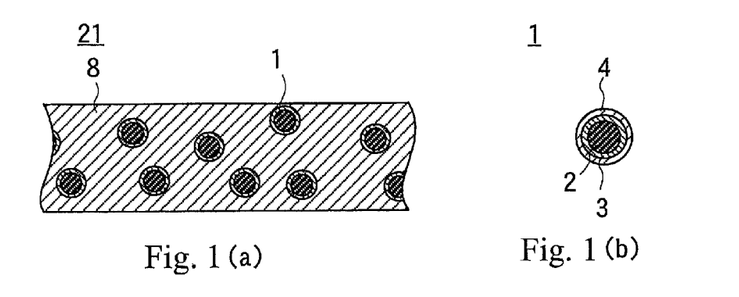
FIG. 1(a) is a diagram for illustrating an anisotropic conductive adhesive of the present invention.
FIG. 1(b) is a sectional view of a conductive particle dispersed in the anisotropic conductive adhesive.

Reference numeral 21 in FIG. 1(*a*) indicates the uncured anisotropic conductive adhesive.

The anisotropic conductive adhesive 21 includes a binder resin 8 having adhesion when uncured, and conductive particles 1, which are dispersed in the binder resin 8.

The binder resin 8 is not limited to a particular type. However, the binder resin 8 that is preferred from the viewpoint of excellent transparency, adhesion, heat resistance, mechanical strength, and electrical insulation is a composition containing an epoxy-based resin and a curing agent of the epoxy-based resin.

Specifically, examples of the epoxy resin include an alicyclic epoxy compound, a heterocyclic epoxy compound and a hydrogenated epoxy compound. As the alicyclic epoxy compound, an alicyclic epoxy compound having at least two epoxy groups within a molecule is preferably used. It may be liquid form or solid form. Specific examples include glycidyl hexahydrobisphenol A, 3,4-epoxycyclohexenylmethyl-3' and 4'-epoxycyclohexenecarboxylate. Among them, because optical transparency suitable for, for example, the mounting of an LED element can be acquired in the cured material, and rapid curing is excellently achieved, glycidyl hexahydrobisphenol A, 3,4-epoxycyclohexenylmethyl-3' or 4'-epoxycyclohexenecarboxylate can be preferably used.

As the heterocyclic epoxy compound, an epoxy compound having a triazine ring can be used, and 1,3,5-tris(2,3-epoxypropyl)-1,3,5-triazine-2,4,6-(1H,3H,5H)-trione can be particularly preferably used.

As the hydrogenated epoxy compound, a hydrogen additive of the alicyclic epoxy compound or the heterocyclic epoxy compound discussed above or another known hydrogenated epoxy resin can be used.

As long as the effects of the present invention are not degraded, other epoxy resins may be also used in addition to and/or together with the above-mentioned epoxy compounds. Examples thereof include the following known epoxy resins: glycidyl ether 1 glycerin which is obtained by making epichlorohydrin react with a polyhydric phenol such as bisphenol A, bisphenol F, bisphenol S, tetramethyl bisphenol A, diaryl bisphenol A, hydroquinone, catechol, resorcin, cresol, tetrabromobisphenol A, trihydroxy biphenyl, benzophenone, bis-resorcinol, bisphenol hexafluoroacetone, tetramethyl bisphenol A, tetramethyl bisphenol F, tris(hydroxyphenyl)methane, bixylenol, phenol novolac or cresol novolac; polyglycidyl ether lp-oxybenzoic acid which is obtained by making epichlorohydrin react with an aliphatic polyhydric alcohol such as neopentyl glycol, ethylene glycol, propylene glycol, thylene glycol, hexylene glycol, polyethylene glycol or polypropylene glycol; glycidyl ether ester 1 phthalic acid which is obtained by making epichlorohydrin react with a hydroxycarboxylic acid such as, β-oxy naphthoic acid; polyglycidyl ester 1 aminophenol which is obtained from a polycarboxylic acid such as methylphthalic acid, isophthalic acid, terephthalic acid, tetra hydro phthalic acid, endomethylene tetrahydrophthalic acid, endomethylene hexahydrophthalic acid, trimellitic acid or polymerized fatty acid; glycidylamino glycidyl ester 1 aniline which is obtained from glycidylamino glycidyl ether 1 amino benzoic acid obtained from aminoalkylphenol; and glycidyl amine 1 epoxy polyolefin that is obtained from toluidine, tribromoaniline, xylylenediamine, diaminocyclohexane, bisaminomethylcyclohexane, 4,4'-diaminodiphenyl methane or 4,4'-diaminodiphenylsulfone. As the curing agent, an acid anhydride, an imidazole compound, dicyan or the like can be used. Among them, an acid anhydride which is unlikely to discolor a curing agent, in particular, an alicyclic acid anhydride curing agent, can be preferably used. Specifically, methylhexahydrophthalic anhydride or the like can be preferably used.

When an alicyclic epoxy compound and an alicyclic acid anhydride curing agent are used together, because there is a tendency that when the amount of alicyclic acid anhydride curing agent used is excessively low, the amount of uncured epoxy is increased whereas when the amount of alicyclic acid anhydride curing agent used is excessively high, the effect of the excessive amount of curing agent facilitates the corrosion of an adherent material, with respect to 100 weight parts of the alicyclic epoxy compound, 80 to 120 weight parts can be preferably used, and 95 to 105 weight parts can be more preferably used.

The binder resin 8 is a resin having thermally curable properties and insulating properties. When the anisotropic conductive adhesive 21 is heated in a manner such that the binder resin 8 is in contact with a material to be adhered and the anisotropic conductive adhesive 21 is adhered to the material to be adhered, the anisotropic conductive adhesive 21 is cured while maintaining adhesion to the material to be adhered.

Reference numeral 12 in FIG. 2(*b*) indicates the cured anisotropic conductive adhesive.

The conductive particles 1 remain dispersed in the cured anisotropic conductive adhesive 12, and a plurality of conductive particles 1 are located between the electrodes 13 and the bumps 6.

The uncured anisotropic conductive adhesive 21 is arranged on the substrate main body 5, and the LED element 20 is further arranged on the uncured anisotropic conductive adhesive 21. When the LED element 20 is pressed against the uncured anisotropic conductive adhesive 21, a bottom surface of the uncured anisotropic conductive adhesive 21 which is on the substrate main body 5's side is brought into contact with the protective film 22 and the bumps 6 of the substrate main body 5, and a surface of the uncured anisotropic conductive adhesive 21 on the LED element 20's side is brought into contact with the protective film 17 and the electrodes 13 of the LED element 20.

The LED element 20 is then pressed against the electrode substrate 11, thereby bringing the conductive particles 1 in the uncured anisotropic conductive adhesive 21 into contact with the electrodes 13 and the bumps 6 both and establishing electrical connection between the electrodes 13 and the bumps 6. The cured binder resin, which is denoted by reference numeral 19, has insulating properties and the conductive particles 1 that are located outside a space between the electrodes 13 and the bumps 6 are not in contact with the other conductive particles 1, thereby avoiding a short circuit between the electrodes 13 and a short circuit between the bumps 6.

A p-n junction is formed inside the LED element 20.

In the case where the connection terminals 15 are connected to an output terminal of a power supply and a voltage is applied between the two connection terminals 15 in a manner such that the p-n junction is forward-biased, a current flows through the p-n junction via the connection terminals 15, the bumps 6, the conductive particles 1, and the electrodes 13 into the p-n junction, and a portion where the p-n junction is located emits light.

A surface of the LED element 20 that faces outward and does not face the electrode substrate 11 is an emission surface from which light is emitted, and, when a transparent package is provided, emits light into the air atmosphere while protected by the transparent package.

The semiconductor chip 9 and the protective film 17 on the semiconductor chip 9 have transparency that transmits emitted light. Among emitted light that is generated in the p-n junction, emitted light that travels toward the emission surface passes through the semiconductor chip 9, the protective film 17, the transparent package, and other components to be emitted to the outside of the light emitting device 7.

The cured binder resin 19 is also transparent with respect to emitted light. A part of emitted light, which travels toward a surface facing the electrode substrate 11 and enters the cured anisotropic conductive adhesive 12, therefore irradiates the conductive particles 1.

As shown in FIG. 1(b), each conductive particle 1 included in the anisotropic conductive adhesives 12, 21 includes a resin particle 2, a base layer 3, which is a thin metal film formed on the surface of the resin particle 2 by electrolytic plating, and a light reflecting layer 4, which is formed on a surface of the base layer 3 by sputtering.

The resin particle 2 is not particularly limited. However, the resin particle 2 that is preferred from the viewpoint of high electrical connection reliability is, for example, a particle of a cross-linkage polystyrene-based resin, a benzoguanamine-based resin, a nylon-based resin, or a polymethacrylate-based (PMMA-based) resin.

The size of the resin particle 2 is not particularly limited. However, an average particle size that is preferred from the viewpoint of high electrical connection reliability is 3 μm to 5 μm.

Here, the resin particle 2 is constructed by forming an acrylic resin into a globular shape, and the base layer 3 is a thin nickel film formed on the surface of the resin particle 2 by electrolytic plating.

The light reflecting layer 4 is a thin film that is formed by sputtering, with the use of a sputtering gas (rare gas), on a sputtering target that includes Ag, Bi, and Nd within a content ratio range discussed later.

Sputtering is one of the methods of forming a thin film on an object, and is performed under vacuum conditions. In sputtering method, an interior of a container is depressurized to turn into vacuum conditions and, in this state, a voltage is applied between an object on which a film is to be formed and the sputtering target to cause glow discharge. The resultant electrons and ions hit the target at high speed, thereby pushing out particles of the target material, and the flung out particles (sputtering particles) adhere to a surface of the object on which a film is to be formed, and form a thin film.

To successfully form a thin film by sputtering on as fine a particle as those in the present invention, fine particles dispersed as primary particles are set in a container inside a device, and the container is rotated to let the fine particles move fluidly. That is, by performing sputtering on the thus fluidized fine particles, sputtering particles of the target material collide with a film forming surface, which is the entire surface of each fine particle, and a thin film is formed on the entire surface of each fine particle.

In addition, known sputtering methods including a diode sputtering method, a magnetron sputtering method, a high frequency sputtering method, and a reactive sputtering method may be adopted as the sputtering method that is applied to the present invention.

During sputtering, the base layer 3 is exposed on the film forming surface at which sputtering particles arrive, and the surface of the resin particle 2 is not exposed. The surface of the resin particle 2 is not damaged by sputtering particles because sputtering particles arrive at the surface of the base layer 3, and thus, the light reflecting layer 4 having a flat surface formed on the conductive particle 1.

Accordingly, emitted light that enters the conductive particle 1 is reflected by the light reflecting layer 4, which is formed on the surface of the base layer 3, and is returned toward a direction in which the LED element 20 is located.

The sputtering target that forms the light reflecting layer 4 is an alloy including Ag, Bi, and Nd. When the sum of the weights Ag, Bi, and Nd is 100 weight %, the target contains Bi at a content ratio of at least 0.1 weight % and at most 3.0 weight %, Nd at a content ratio of at least 0.1 weight % and at most 2.0 weight %, and Ag at a content ratio that is calculated by subtracting the content ratio of Bi and the content ratio of Nd from 100 weight %.

A thin silver alloy film containing Ag, Bi, and Nd at those content ratios has in the reflectance of light having a wavelength range of from at least 360 nm to at most 740 nm higher than the light reflectance of a thin film that does not contain silver (such as, a thin gold film or a thin Ni film).

Figure 3:
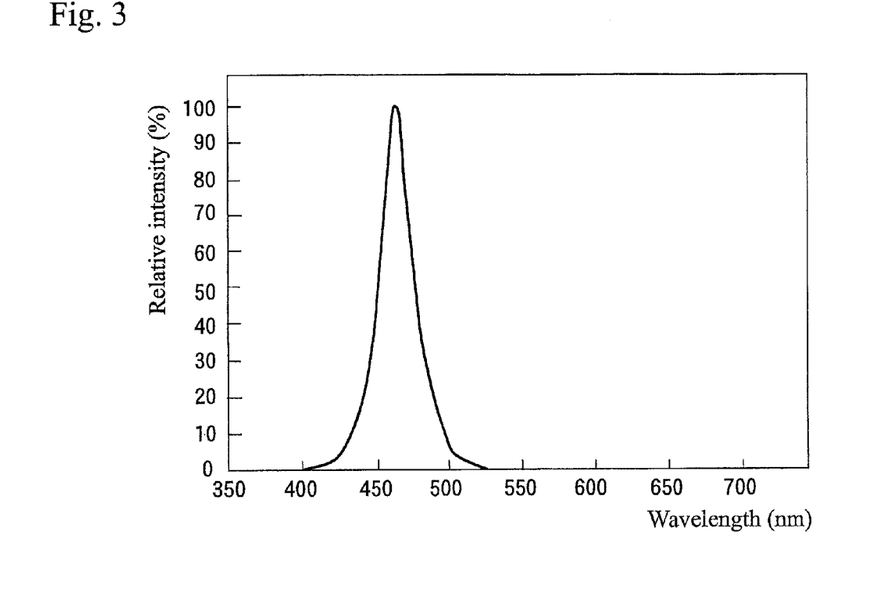
FIG. 3 is a graph for showing a peak of light that is emitted by a blue LED element used in the present invention.

On the other hand, the LED element 20 included in the light emitting device 7 of the present invention, is an LED element having a peak, where the light intensity is maximum, in a wavelength range of from at least 360 nm to at most 500 nm as shown in FIG. 3. Light emitted by the LED element 20 is reflected by the conductive particle 1 at a high reflectance to be returned toward the LED element 20, and the reflected light having intensity higher than the light reflected by a thin gold film, a thin Ni film, or the like exits to the outside of the light emitting device 7 from the emission surface of the semiconductor chip 9.

In the present invention, the content ratio of the conductive particles 1 to the thermally curable insulating binder resin 8 is not particularly limited, however, it is preferred that the content of the conductive particles 1 is at least 1 part by weight and at most 100 parts by weight with respect to 100 parts by weight of the binder resin 8 when securing light reflectance, anti-migration properties, and insulation is considered.

In addition to the conductive particles 1, a reflective insulating filler (not shown) is dispersed in the binder resin 8. The reflective insulating filler in this example is white $SiO_2$, for instance. Emitted light that enters the reflective insulating filler instead of the conductive particles 1 is reflected at a reflectance lower than the reflectance of the conductive particles 1, and the reflected light is returned toward the LED element 20 side.

A surface of the substrate main body 5 is colored white so that emitted light that enters the surface of the substrate main body 5 is reflected at a reflectance lower than the reflectance of the conductive particles 1, and the reflected light is returned toward the LED element 20.

The reflected light that is reflected by the reflective insulating filler or the surface of the substrate main body 5 also passes through the LED element 20 to emit to the outside from the emission surface.

Light emitted by the LED element 20 is not transmitted through the electrodes 13, the bumps 6, and the connection terminals 15.

When the light emission time of the light emitting device 7 becomes long, a current flows in the conductive particles 1 for a long period of time, and (electro-)migration causes a wire breakage in a thin Ag film. The thin Ag alloy film containing Bi and Nd in the weight % range discussed above has a chance of migration less than a thin film of pure silver.

Therefore, a wire breakage due to migration therefore does not occur in the light emitting device 7 of the present invention.

The reflectance of a thin metal film varies depending on the wavelength of incident light.

Figure 6:
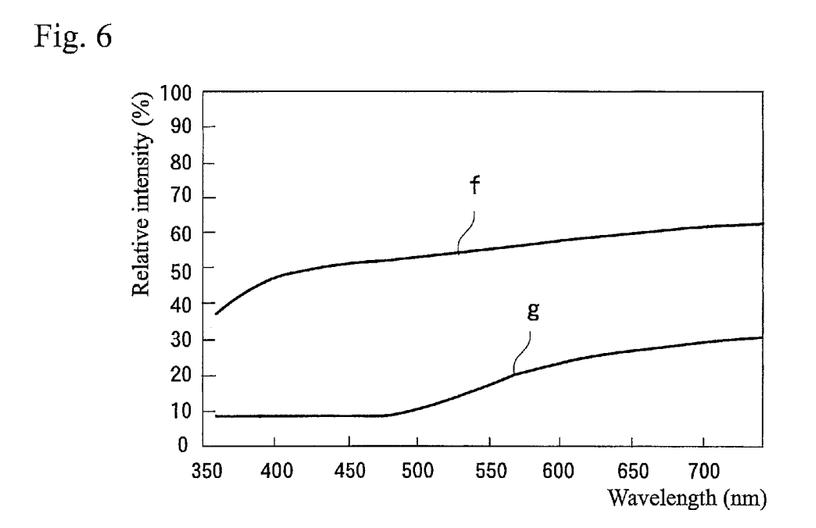
FIG. 6 is a graph for showing reflectance-wavelength relationship between a conductive particle used in the present invention and a conductive particle of a comparative example on which a thin gold film is formed.

FIG. 6 is a graph showing the relationship of reflectance to the wavelength of incident light. Curve f in the graph of FIG. 6 represents the reflectance of an anisotropic conductive adhesive that is observed when the light reflecting layer 4 of the conductive particle 1 discussed above is formed by sputtering of a sputtering target that contains Bi at a content ratio of 0.7 weight % and Nd at a content ratio of 0.3 weight %, (and Ag at a content ratio of 99 weight %), with respect to the total weight of Ag, Bi, and Nd of 100 weight %.

Curve g in the graph of FIG. 6 represents the reflectance of an anisotropic conductive adhesive dispersed with conductive particles each having a light reflecting layer formed from an Au layer and that is exposed on the surface of the conductive particle.

The anisotropic conductive adhesive of curve f and the anisotropic conductive adhesive of curve g have the same configuration, except the configuration of the light reflecting layer on the surface of the conductive particle.

As shown in FIG. 6, the anisotropic conductive adhesive of the present invention has a high reflectance of 30% or more in a range of from at least 360 nm to at most 500 nm, compared to the conductive particle having an Au layer.

In the following description, an LED element having a peak in a range of from 360 nm or more to 500 nm or less is referred to as a blue LED element. While the light emitting device 7 of the embodiment discussed above has no other LED elements than the blue LED element having the emitted light intensity distribution of FIG. 3, the present invention also encompasses a light emitting device which has a LED element having a peak outside the range of 360 nm to 500 nm also arranged in addition to the blue LED element adhered to the substrate by the anisotropic conductive adhesive of the present invention so as to emit blue light and the other colors together.

Figure 5:
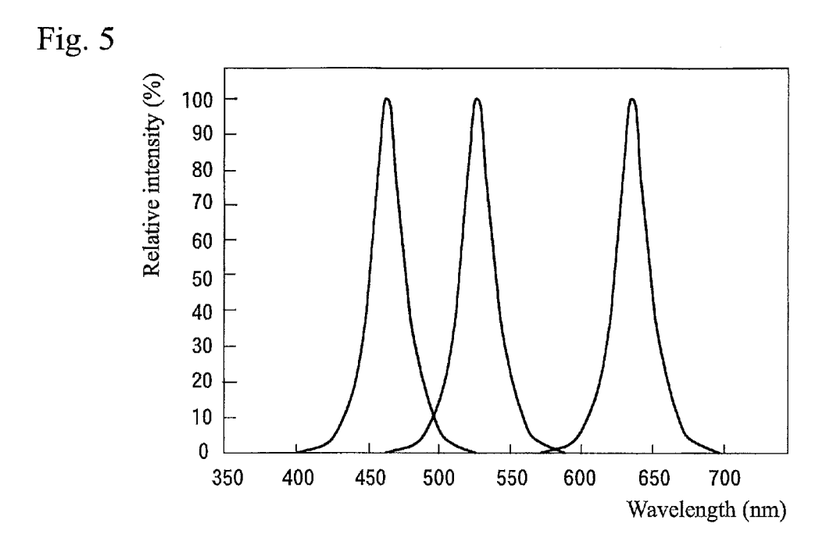
FIG. 5 is a graph for showing a peak of light that is emitted by a red LED element, a green LED element, and the blue LED element.

FIG. 5 is an example of the relative intensity distribution of light that is emitted by a light emitting device which emits white color. The distribution is of a case where an LED elements having emission light of blue, green and red, respectively, are arranged inside of the light emission device. This light emitting device is also encompassed in the present invention as long as the blue LED element is adhered to a substrate by the anisotropic conductive adhesive of the present invention.

Figure 4:
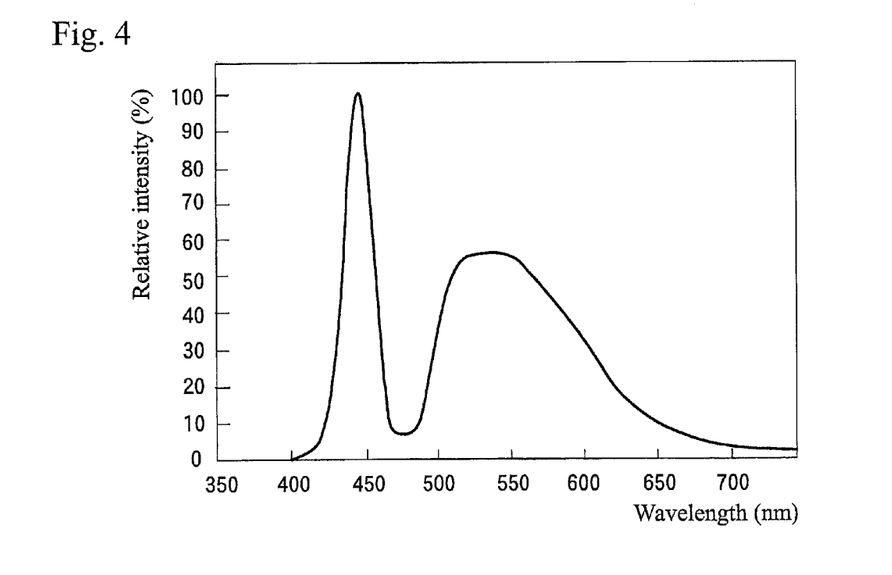
FIG. 4 is a graph for showing a wavelength distribution of light emitted from a light emitting device of the present invention using the blue LED element and a fluorescent material.

A light emitting device having a blue LED element adhered to a substrate by the anisotropic conductive adhesive of the present invention and a fluorescent material irradiated with the emitted light of the blue LED element arranged therein has an emitted light intensity distribution as shown in FIG. 4, and emits white light. This light emitting device is also encompassed in the present invention as long as the blue LED element is adhered to a substrate by the anisotropic conductive adhesive of the present invention.

The base layer of the conductive particle used in the present invention can be a thin film of other metals than nickel, as long as the film is formed by electrolytic plating.

A preferred form of the anisotropic conductive adhesive of the present invention is the paste form.

<Processes of Manufacturing the Conductive Particles, the Anisotropic Conductive Adhesive, and the Light Emitting Device>

A process of manufacturing the anisotropic conductive adhesive of the present invention is described.

First, resin particles (here, acrylic resin particles) having an average particle size of 5 μm are immersed in a nickel plating solution, and a thin nickel film having a thickness of at least 0.03 μm and at most 3.0 μm is formed by electrolytic plating as the base layer on the surface of each resin particle. The surface of the resin particle is covered with the base layer and is not exposed.

A sputtering target is arranged in advance in a sputtering device (powder sputtering device, a product of Kyoritsu Group). The sputtering target contains Ag, Bi, and Nd, with the content ratio of Bi set to at least 0.1 weight % and at most 3.0 weight % and the content ratio of Nd set to at least 0.1 weight % and at least 2.0 weight % with respect to the total weight of Ag, Bi, and Nd of 100 weight %. The resin particles (each of which having a base layer formed on its surface) are put in a rotary container, which is arranged in the sputtering device.

Sputtering is performed by setting the interior of the sputtering device under vacuum conditions, introducing a sputtering gas, and applying a voltage to the sputtering target. Sputtering particles thus arrive at a surface of the base layer to form the light reflecting layer from a silver alloy that has the same composition as that of the sputtering target.

When the light reflecting layer is formed, the rotary container is rotated so that, by rotating each resin particle on which the base layer is formed inside the rotary container, sputtering particles arrive evenly at the surface of the base layer. The light reflecting layer is thus formed to a uniform thickness on the surface of the base layer, and a conductive particle of which the base layer is not exposed can be obtained.

The surface of the resin layer is not exposed so that rough surface of the resin particle caused by the impact of sputtering particles does not occur.

After the light emitting layer is formed to a predetermined thickness, sputtering is ended and the conductive particles are carried out of the sputtering device. FIG. 1(*b*) is a sectional view of each conductive particle 1.

Next, the anisotropic conductive adhesive is produced by mixing and dispersing at least one part by weight and at most 100 parts by weight of the conductive particles brought out of the sputtering device with respect to 100 parts by weight of the binder resin, which is a thermally curable resin.

The uncured anisotropic conductive adhesive 10 which has adhesion is arranged on the bumps 6 of the electrode substrate 11 as shown in FIG. 2(*a*). The LED element 20 is next put on the anisotropic conductive adhesive 10 as shown in FIG. 2(*b*), and is heated while pressed in order to cure the anisotropic conductive adhesive 10.

The electrodes 13 of the LED element 20 face toward a surface of the electrode substrate 11. With the conductive particles 1 located between the electrodes 13 and the bumps 6, the LED element 20 is heated while pressed and the anisotropic conductive adhesive 10 is cured.

Reference numeral 12 in FIG. 2(*b*) indicates the cured anisotropic conductive adhesive.

The conductive particles 1 are sandwiched between the electrodes 13 and the bumps 6 and are in contact with both. The conductive particles 1 electrically connect the electrodes 13 and the bumps 6 to each other, and fix the LED element 20 to the electrode substrate 11, thereby yielding the light emitting device 7 described above.

When a current flowing in the LED element 20 causes light emission, the conductive particles 1 located where the semiconductor chip 9 of the LED element 20 faces the electrode substrate 11 reflect the emitted light, and the reflected light is emitted to the outside of the light emitting device 7.

The manufacturing of the light emitting device 7 may include sealing in which the LED element 20 is covered entirely with a transparent mold resin.

Examples

Samples used in measurement are described.

First, a thin nickel film is formed on each acrylic resin particle by electrolytic plating as the base layer. Next, sputtering is performed on three different sputtering targets, each containing Ag, Bi, and Nd with the content ratio of Bi set to at least 0.1 weight and at most 3.0 weight and the content ratio of Nd set to at least 0.1 weight % and at most 2.0 weight % with respect to the total weight of Ag, Bi, and Nd of 100 weight %. The light reflecting layer is formed through the sputtering on a surface of the base layer in each sputtering target, thereby producing three types of conductive particles.

The produced conductive particles of each type are dispersed in the binder resin to obtain an anisotropic conductive adhesive for each of Examples 1 to 3. The thin nickel film has a thickness of 0.10 μm, and the light reflecting layer has a thickness of 0.2 μm.

The compositions of the sputtering targets used to form the respective light reflecting layers of conductive particles that are dispersed in the anisotropic conductive adhesives of Examples 1 to 3 and in anisotropic conductive adhesives of Comparative Examples 3 to 5, which are described later, are shown in a "composition ratio" field in a "topmost layer metal" field of Table 1.

The composition ratio of the sputtering target of the Example 1 is Ag:Bi:Nd=99:0.7:0.3, the composition ratio of the sputtering target of the Example 2 is Ag:Bi:Nd=99.8:0.1:0.1, and the composition ratio of the sputtering target of the Example 3 is Ag:Bi:Nd=95:3:2.

In Comparative Examples 3, 4, and 5, conductive particles of the same configuration as those of Examples 1 to 3 are produced by the same process as that of Examples 1 to 3, except for using sputtering targets having content ratios different from the one in the present invention, and thus, a light reflecting layer of a different composition is formed. The produced conductive particles are dispersed in the binder resin to obtain an anisotropic conductive adhesive for each of Comparative Examples 3 to 5.

The sputtering targets of Comparative Examples 3 to 5 have composition ratios pure Ag, Ag:Bi:Nd=99.9:0.05:0.05, and Ag:Bi:Nd=94:3:3, respectively.

In Comparative Example 1, conductive particles are produced by forming a light reflecting layer made of a thin gold (Au) film having a thickness of 0.2 μm by electrolytic plating on a surface of each resin particle where an acrylic resin is exposed. In Comparative Example 2, conductive particles are produced by forming a light reflecting layer from a thin nickel film having a thickness of 0.2 μm by electrolytic plating on a surface of each resin particle where an acrylic resin are exposed. The produced conductive particles of Comparative Examples 1 and 2 were each dispersed in the binder resin to obtain an anisotropic conductive adhesive.

In Examples 1 to 3 and Comparative Examples 1 to 5, 20 parts by weight of conductive particles are dispersed in 100 parts by weight (excluding the solvent) of the binder resin. The binder resin of the anisotropic conductive adhesive in

TABLE 1

Measurement results

| | | Example 1 | Example 2 | Example 3 | Comparative example 1 | Comparative example 2 | Comparative example 3 | Comparative example 4 | Comparative example 5 |
|---|---|---|---|---|---|---|---|---|---|
| Core particle | Type | Ni plated acrylic particle | Ni plated acrylic particle | Ni plated acrylic particle | Acrylic resin | Acrylic resin | Ni plated acrylic particle | Ni plated acrylic particle | Ni plated acrylic particle |
| | Particle size (μm) | 5 | 5 | 5 | 5 | 5 | 5 | 5 | 5 |
| Topmost layer metal | Type Composition ratio (wt %) | Ag:Bi:Nd 99:0.7:0.3 | Ag:Bi:Nd 99.8:0.1:0.1 | Ag:Bi:Nd 95:3:2 | Au | Ni | Ag | Ag:Bi:Nd 99.9:0.05:0.05 | Ag:Bi:Nd 94:3:3 |
| Particle appearance | Color | Gray | Gray | Gray | Brown | Black | Gray | Gray | Gray |
| Reflectance*[1] | (%) | 40 | 45 | 35 | 8 | 9 | 55 | 50 | 28 |
| Optical characteristics | Total luminous flux amount (mlm) Initial | 330 | 350 | 300 | 200 | 210 | 390 | 370 | 270 |
| | Rate of charge of total luminous flux amount (%) After 85° C. 85% RH −500 H Emission | 0 | 0 | 0 | 0 | 0 | −20% | −15% | 0 |
| Electrical characteristics | Electrical connection reliability Initial | ○ | ○ | ○ | ○ | ○ | ○ | ○ | ○ |
| | After 85° C. 85% RH −500 H Emission | ○ | ○ | ○ | ○ | ○ | X | X | ○ |

*[1]"Reflectance" here refers to the proportion of the amount of reflected light to the amount of incident light having a wavelength of 450 nm.

each Example and each Comparative Example is the same type of resin, and has the same configuration except for the conductive particles.

The main component of the binder resin used is an epoxy curing adhesive (CEL2021P-MeHHPA, a product of Daicel Corporation).

The diameters of the resin particle of which the acrylic surface is exposed where gold thin film is formed, the resin particle of which the acrylic surface is exposed where nickel thin film is formed as a light reflective layer, and the resin particle of which the surface is a nickel layer where silver alloy thin film (including pure silver) is formed as a light reflective layer are 5 µm, respectively.

<Resin Particle Colors>

The color of the resin particles to be contained in the anisotropic conductive adhesive in each of Examples 1 to 3 and Comparative Examples 1 to 5 is observed. The results of the observation are shown in a "particle appearance" field of Table 1. It is understood in Table 1 that the conductive particles of Comparative Examples 1 and 2 are colored, thereby causing reflected light of a light emitting element to be colored and returned.

<Reflectance Measurement>

The anisotropic conductive adhesive of each of Examples 1 to 3 and Comparative Examples 1 to 5 is applied to a white board to a thickness of 100 µm. After loading the white board into a thermal curing device and curing the adhesive by heat, the reflectance of the adhesive is measured with a spectrophotometer (CM-3600d, a product of Konica Minolta, Inc.). The adhesive is cured by heating in a condition of 200° C. for 1 minute.

The results of the measurement are shown in a "reflectance" field of Table 1.

<Optical Characteristics>

The anisotropic conductive adhesive of each of Examples 1 to 3 and Comparative Examples 1 to 5 is applied to a surface of an electrode substrate (epoxy glass substrate) on which LED-mounting Au electrodes for mounting LED with Au bumps are arranged. An LED element is then mounted to the electrode substrate to produce a light emitting device for each of Examples 1 to 3 and Comparative Examples 1 to 5.

The LED element was mounted by performing thermal press fit at a temperature of 200° C. and at a pressing pressure of 1 kg per element for 20 seconds.

A voltage of 3.2 V is applied to the obtained light emitting device to cause the LED element to emit light so as to flow a current of 20 mA in the LED element. The light emitted by the light emitting device of each of Examples 1 to 3 and Comparative Examples 1 to 5 is measured for total luminous flux amount using a total light amount measuring device (a total luminous flux measuring system (integrating sphere) LE-2100, a product of OTSUKA ELECTRONICS Co., LTD) in a condition of normal temperature and normal humidity.

The results of the measurement are shown in an "initial" field of "optical characteristics" of Table 1.

After emitting light in an environment where the temperature is 85° C. and the humidity was 85% RH for 500 hours, the light emitting device of each of Examples 1 to 3 and Comparative Examples 1 to 5 is measured for total luminous flux amount using the same measuring device to calculate the rate of change of total luminous flux amount as the ratio of difference between the initial total luminous flux amount and the post-500-hour-emission total luminous flux amount.

The results of the calculation are shown in a "rate of change of total luminous flux amount" field of Table 1.

In Comparative Examples 3 and 4, of which the content ratio of Ag is high, the reflectance is high but the rate of change of total luminous flux amount is high, which means time degradation properties are poor.

<Reliability Test>

The electrodes arranged on the electrode substrate used in the measurement of the total luminous flux amount are provided parallel to each other, with a strip of space of 100 µm wide separating one electrode from the other electrode. The anisotropic conductive adhesive of each of Examples 1 to 3 and Comparative Examples 1 to 5 is applied so as to be in contact with the electrodes and to fill the space between the electrodes and a space between the bumps.

As a result of emitting light in an environment where the temperature is 85° C. and the humidity was 85% RH for 500 hours, a leak current is detected between the electrodes in Comparative Examples 3 and 4, where the content ratio of Ag is high. Comparative Examples 3 and 4 have a value "×" in an "electrical connection reliability" field of Table 1.

In Comparative Examples 3 and 4, discoloration of the conductive particles is observed and the occurrence of migration is confirmed.

REFERENCE NUMERAL LIST 1 conductive particle
2 resin particle
3 base layer
4 light reflecting layer
7 light emitting device
9 semiconductor chip
11 electrode substrate
10, 12, 21 anisotropic conductive adhesive
20 LED element

What is claimed is:

1. An anisotropic conductive adhesive for electrically connecting an electrode substrate to an LED element having a peak which is a maximum intensity of emitted light, positioned within a range of a wavelength at least 360 nm and at most 500 nm, by adhering electrodes of the LED element to electrodes of the electrode substrate, the anisotropic conductive adhesive comprising:
   conductive particles; and
   an adhesive binder,
   wherein each of the conductive particles includes
      a resin particle,
      a base layer formed on a surface of the resin particle by electrolytic plating method, and
      a conductive light reflecting layer formed on a surface of the base layer by sputtering method, the conductive light reflecting layer including Ag, Bi, and Nd, and
   wherein the light reflecting layer is formed by sputtering of a sputtering target which contains Ag, Bi, and Nd having a content ratio of Bi set to at least 0.1 weight % and at most 3.0 weight % and a content ratio of Nd set to at least 0.1 weight % and at most 2.0 weight % with respect to a total weight of Ag, Bi, and Nd of 100 weight %.

2. The anisotropic conductive adhesive according to claim 1, wherein the anisotropic conductive adhesive is a cured anisotropic conductive adhesive, and the cured anisotropic conductive adhesive has a reflectance of 30% or higher at a wavelength in a range of at least 360 nm and at most 740 nm.

3. The anisotropic conductive adhesive according to claim 1, wherein the base layer is made of a thin nickel film.

4. The anisotropic conductive adhesive according to claim 1, wherein
the adhesive binder is thermally curable and has insulating properties, and
a weight ratio of the conductive panicles to the adhesive binder is in a range of from 1:100 to 100:100.

5. A light emitting device comprising an LED element adhered to a substrate by an anisotropic conductive adhesive,
wherein the LED element having a peak which is a maximum intensity of emitted light, positioned within a range of a wavelength at least 360 nm and at most 500 nm;
wherein the anisotropic conductive adhesive which includes conductive particles in an adhesive,
wherein each of the conductive particles includes
a resin particle,
a base layer formed on a surface of the resin particle by electrolytic plating method, and
a conductive light reflecting layer formed on a surface of the base layer by sputtering method, the conductive light reflecting layer containing Ag, Bi, and Nd, and
wherein the light reflecting layer is formed by sputtering of a sputtering target that contains Ag, Bi, and Nd with a content ratio of Bi set to at least 0.1 weight % and at most 3.0 weight % and a content ratio of Nd set to at least 0.1 weight % and at most 2.0 weight % with respect to a total weight of Ag, Bi, and Nd of 100 weight %.

6. An anisotropic conductive adhesive manufacturing method for manufacturing an anisotropic conductive adhesive by dispersing conductive particles in an adhesive,
wherein the conductive particles of the anisotropic conductive adhesive are formed by:
forming a base layer on resin particles, where the base layer forms on the resin particles by performing an electrolytic plating method on a surface of each resin particle; and
forming a light reflecting layer on a surface of the base layer by performing sputtering on a sputtering target that contains Ag, Bi, and Nd with a content ratio of Bi set to at least 0.1 weight % and at most 3.0 weight % and a content ratio of Nd set to at least 0.1 weight % and at most 2.0 weight % with respect to a total weight of Ag, Bi, and Nd of 100 weight %.

* * * * *